US012140715B2

(12) United States Patent
Abe et al.

(10) Patent No.: US 12,140,715 B2
(45) Date of Patent: Nov. 12, 2024

(54) RADIATION DETECTOR AND METHOD FOR MANUFACTURING RADIATION DETECTOR

(71) Applicants: Kyoto University, Kyoto (JP); HAMAMATSU PHOTONICS K.K., Hamamatsu (JP)

(72) Inventors: Keiji Abe, Hamamatsu (JP); Toshiyuki Izawa, Hamamatsu (JP); Kenji Makino, Hamamatsu (JP); Seiichiro Mizuno, Hamamatsu (JP); Takumi Ikenoue, Kyoto (JP); Yuki Haruta, Kyoto (JP); Masao Miyake, Kyoto (JP); Tetsuji Hirato, Kyoto (JP)

(73) Assignees: Kyoto University, Kyoto (JP); HAMAMATSU PHOTONICS K.K., Hamamatsu (JP)

( * ) Notice: Subject to any disclaimer, the term of this patent is extended or adjusted under 35 U.S.C. 154(b) by 688 days.

(21) Appl. No.: 17/252,595

(22) PCT Filed: Feb. 21, 2019

(86) PCT No.: PCT/JP2019/006625
§ 371 (c)(1),
(2) Date: Dec. 15, 2020

(87) PCT Pub. No.: WO2020/003603
PCT Pub. Date: Jan. 2, 2020

(65) Prior Publication Data
US 2021/0255341 A1 Aug. 19, 2021

(30) Foreign Application Priority Data
Jun. 26, 2018 (JP) .................................. 2018-120931

(51) Int. Cl.
*G01T 1/24* (2006.01)
*G01N 23/04* (2018.01)
(Continued)

(52) U.S. Cl.
CPC .............. *G01T 1/24* (2013.01); *G01N 23/04* (2013.01); *G01N 23/083* (2013.01);
(Continued)

(58) Field of Classification Search
CPC .......... G01T 1/24; G01T 1/247; G01T 1/241; G01N 23/04; G01N 23/083;
(Continued)

(56) References Cited

U.S. PATENT DOCUMENTS 5,843,516 A * 12/1998 Derbenwick ..... H01L 21/02197
427/96.7
2016/0154123 A1* 6/2016 Ohashi .................. G01T 1/2023
250/361 R
(Continued)

FOREIGN PATENT DOCUMENTS

CN 106291654 A 1/2017
CN 108028263 A 5/2018
(Continued)

OTHER PUBLICATIONS

Sergii Yakunin et al., "Detection of X-ray photons by solution-processed lead halide perovskites", Nature Photonics, vol. 9 May 25, 2015, p. 444-p. 449.
(Continued)

*Primary Examiner* — David P Porta
*Assistant Examiner* — Mamadou Faye
(74) *Attorney, Agent, or Firm* — Faegre Drinker Biddle & Reath LLP

(57) ABSTRACT

A radiation detector includes a substrate including a first electrode portion, a radiation absorption layer disposed on
(Continued)

one side with respect to the substrate and configured of a plurality of perovskite crystals, and a second electrode portion disposed on the one side with respect to the radiation absorption layer and being opposite to the first electrode portion with the radiation absorption layer interposed therebetween. Each of the plurality of perovskite crystals is formed to extend with a first direction in which the first electrode portion and the second electrode portion are opposite to each other as a longitudinal direction in a region between the first electrode portion and the second electrode portion in the radiation absorption layer.

16 Claims, 12 Drawing Sheets

(51) Int. Cl.

| | | |
|---|---|---|
| G01N 23/083 | (2018.01) | |
| H01G 9/00 | (2006.01) | |
| H01G 9/20 | (2006.01) | |
| H10K 30/30 | (2023.01) | |
| H10K 30/81 | (2023.01) | |
| H10K 39/36 | (2023.01) | |
| H10K 71/15 | (2023.01) | |
| H10K 85/30 | (2023.01) | |

(52) U.S. Cl.
CPC ......... *H01G 9/0036* (2013.01); *H01G 9/2009* (2013.01); *H10K 30/30* (2023.02); *H10K 30/81* (2023.02); *H10K 39/36* (2023.02); *H10K 71/15* (2023.02); *H10K 85/30* (2023.02); *G01N 2223/04* (2013.01); *G01N 2223/401* (2013.01); *G01N 2223/50* (2013.01)

(58) Field of Classification Search
CPC ......... G01N 2223/04; G01N 2223/401; G01N 2223/50; H01G 9/0036; H01G 9/2009; H10K 30/30; H10K 30/81; H10K 39/36; H10K 71/15; H10K 85/30; Y02E 10/542; Y02E 10/549; Y02P 70/50; H01L 27/14676; H01L 27/144; H01L 27/146
See application file for complete search history.

(56) References Cited

U.S. PATENT DOCUMENTS

| | | | |
|---|---|---|---|
| 2017/0293037 A1* | 10/2017 | Schmidt | ................... G01T 1/24 |
| 2017/0322323 A1* | 11/2017 | Fischer | ................. G01T 1/2006 |
| 2017/0355905 A1* | 12/2017 | Bourret-Courchesne | ................... G01T 1/2023 |
| 2018/0017679 A1 | 1/2018 | Valouch et al. | |
| 2018/0277608 A1* | 9/2018 | Lifka | .................... H10K 39/36 |
| 2018/0369861 A1* | 12/2018 | Katori | ................... H10K 30/80 |
| 2020/0225367 A1* | 7/2020 | Kanatzidis | .......... H01L 31/0272 |

FOREIGN PATENT DOCUMENTS

| | | |
|---|---|---|
| CN | 108183119 A | 6/2018 |
| JP | H4-145668 A | 5/1992 |
| JP | 2591533 B2 | 3/1997 |
| JP | 2007-103846 A | 4/2007 |
| JP | 2017-090186 A | 5/2017 |
| JP | 2017-133077 A | 8/2017 |
| JP | 2018-004396 A | 1/2018 |
| KR | 10-2017-0029370 A | 3/2017 |
| KR | 10-2017-0067452 A | 6/2017 |
| KR | 10-2017-0112563 A | 10/2017 |
| TW | 201804629 A | 2/2018 |
| WO | WO-2017/046390 A1 | 3/2017 |
| WO | WO-2017/110953 A1 | 6/2017 |
| WO | WO-2017/211603 A1 | 12/2017 |

OTHER PUBLICATIONS

Nishinaka, Hiroyuki, "Organic-inorganic perovskite semiconductor for application of light-emitting devices", R&D Grant, Final Research Report, Kyoto Technoscience Center, 2015,#4.
International Preliminary Report on Patentability mailed Jan. 7, 2021 for PCT/JP2019/006625.
Yihui He et al., "High spectral resolution of gamma-rays at room temperature by perovskite CsPbBr3 single crystals, Nature Communications", Apr. 23, 2018, vol. 9, Article No. 1609, p. 1-p. 8.
O. Semeniuk et al., "Characterization of polycrystalline lead oxide for application in direct conversion X-ray detectors, Scientific Reports", Aug. 17, 2017, vol. 7, Article No. 8659, p. 1-p. 10.
M. Simon et al., "Analysis of lead oxide (PbO) layers for direct conversion X-ray detection, IEEE Transactions on Nuclear Science", Oct. 2005, vol. 52, issue 5, pp. 2035-2040, p. 2035-p. 2005.

* cited by examiner

RADIATION DETECTOR AND METHOD FOR MANUFACTURING RADIATION DETECTOR

TECHNICAL FIELD

The present disclosure relates to a radiation detector and a method of manufacturing the radiation detector.

BACKGROUND ART

Perovskite materials have been suggested as materials applicable to a radiation absorption layer of a radiation detector. Since perovskite materials are inexpensive as compared with CsI, a-Se, CdTe, or the like, perovskite materials are expected to have superiority in fields in which large-area radiation detectors are required (for example, the fields of medicine and non-destructive inspection). Non-Patent Literature 1 describes a direct conversion type radiation detector including a radiation absorption layer formed of a perovskite material.

CITATION LIST

Non-Patent Literature

Non-Patent Literature 1: "Detection of X-ray photons by solution-processed lead halide perovskites," NATURE PHOTONICS, UK, Nature Publishing Group, May 25, 2015, Vol. 9, p. 444-449

SUMMARY OF INVENTION

Technical Problem

In the direct conversion type radiation detector described above, it is desirable for a thickness of a radiation absorption layer to be large from the viewpoint of ensuring radiation absorption efficiency. However, when the thickness of the radiation absorption layer increases, a movement distance of charges (electrons and holes) generated in the radiation absorption layer due to the absorption of the radiation increases, and thus there is concern about a decrease in charge collection efficiency or an increase in crosstalk between a plurality of pixels.

Therefore, an object of the present disclosure is to provide a radiation detector capable of ensuring radiation absorption efficiency while curbing a decrease in charge collection efficiency and an increase in crosstalk between a plurality of pixels, and a method for manufacturing such a radiation detector.

Solution to Problem

A radiation detector according to one aspect of the present disclosure includes a substrate including a first electrode portion, a radiation absorption layer disposed on one side with respect to the substrate and configured of a plurality of perovskite crystals, and a second electrode portion disposed on the one side with respect to the radiation absorption layer and being opposite to the first electrode portion with the radiation absorption layer interposed therebetween, wherein each of the plurality of perovskite crystals is formed to extend with a first direction in which the first electrode portion and the second electrode portion are opposite to each other as a longitudinal direction in the region between the first electrode portion and the second electrode portion in the radiation absorption layer.

In this radiation detector, the radiation absorption layer is configured of the plurality of perovskite crystals, and each of the plurality of perovskite crystals is formed to extend with the first direction in which the first electrode portion and the second electrode portion are opposite to each other as a longitudinal direction in the region between the first electrode portion and the second electrode portion of the radiation absorption layer. Thereby, even when a thickness of the radiation absorption layer is increased to ensure the radiation absorption efficiency, a decrease in the charge collection efficiency in the plurality of first electrodes or an increase in crosstalk between the plurality of first electrodes is curbed, for example, in a case in which the first electrode portion is configured of a plurality of first electrodes. Therefore, according to this radiation detector, it is possible to ensure the radiation absorption efficiency while curbing a decrease in the charge collection efficiency or an increase in crosstalk between a plurality of pixels.

In the radiation detector according to one aspect of the present disclosure, a length of the perovskite crystal in the first direction may be 2 or more when a width of the perovskite crystal in a second direction perpendicular to the first direction is 1 in the region between the first electrode portion and the second electrode portion. This makes it possible to more reliably curb a decrease in charge collection efficiency and an increase in crosstalk between a plurality of pixels.

In the radiation detector according to one aspect of the present disclosure, a length of the perovskite crystal in the first direction may be 10 μm or more in the region between the first electrode portion and the second electrode portion. This makes it easier to increase the thickness of the radiation absorption layer, and thus it is possible to easily and reliably ensure the radiation absorption efficiency.

In the radiation detector according to one aspect of the present disclosure, the first electrode portion may be configured of a plurality of first electrodes, and a width of the perovskite crystal in a second direction perpendicular to the first direction may be equal to or smaller than an arrangement pitch of the plurality of first electrodes in the region between the first electrode portion and the second electrode portion. Alternatively, in the radiation detector according to one aspect of the present disclosure, the second electrode portion may be configured of a plurality of second electrodes, and a width of the perovskite crystal in a second direction perpendicular to the first direction is equal to or smaller than an arrangement pitch of the plurality of second electrodes in the region between the first electrode portion and the second electrode portion. With this, it is possible to more reliably curb an increase in crosstalk between a plurality of pixels.

In the radiation detector according to one aspect of the present disclosure, an existence rate of the perovskite crystals may be 80% or more in the region between the first electrode portion and the second electrode portion. This makes it possible to ensure radiation absorption efficiency more reliably.

In the radiation detector according to one aspect of the present disclosure, the perovskite crystal may be in contact with at least another perovskite crystal in the region between the first electrode portion and the second electrode portion. This makes it possible to ensure radiation absorption efficiency more reliably.

In the radiation detector according to one aspect of the present disclosure, a length of the perovskite crystal in the first direction may be smaller than a thickness of the radiation absorption layer in the first direction in the region between the first electrode portion and the second electrode portion. Thereby, even when a thickness of the radiation absorption layer is increased to ensure the radiation absorption efficiency, it is possible to reliably form the radiation absorption layer configured of the plurality of perovskite crystals each extending with the first direction as the longitudinal direction.

In the radiation detector according to one aspect of the present disclosure, a thickness of the radiation absorption layer in the first direction may be 100 μm or more in the region between the first electrode portion and the second electrode portion. This makes it possible to ensure radiation absorption efficiency more reliably.

A method for manufacturing a radiation detector according to one aspect of the present disclosure includes a first step of generating mist from a solution containing a perovskite material, a second step of mixing the mist with a carrier gas, a third step of spraying the carrier gas containing the mist to a substrate including a first electrode portion in a state in which the substrate is heated, forming a plurality of perovskite crystals to extend with a thickness direction of the substrate as a longitudinal direction in a region corresponding to the first electrode portion in a region on the substrate, and forming a radiation absorption layer configured of the plurality of perovskite crystals on one side with respect to the substrate, and a fourth step of forming a second electrode portion on the one side with respect to the radiation absorption layer, the second electrode portion being opposite to the first electrode portion with the region corresponding to the first electrode portion interposed therebetween.

According to this method for manufacturing a radiation detector, it is possible to manufacture a radiation detector including the radiation absorption layer as described above.

In the method for manufacturing a radiation detector according to one aspect of the present disclosure, the first step may include generating the mist from the solution through ultrasonic vibration. This makes it possible to easily and reliably generate a suitable mist.

In the method for manufacturing a radiation detector according to one aspect of the present disclosure, the second step may include mixing a dilution gas with the carrier gas. This makes it possible to adjust a concentration of the mist, which is important for formation of the plurality of perovskite crystals to extend with the thickness direction of the substrate as the longitudinal direction.

In the method for manufacturing a radiation detector according to one aspect of the present disclosure, the third step may include heating the substrate to a temperature of 110° C. or higher and 170° C. or lower. This makes it possible to reliably form a plurality of perovskite crystals extending with the thickness direction of the substrate as a longitudinal direction.

In the method for manufacturing a radiation detector according to one aspect of the present disclosure, the third step includes heating the substrate to a temperature of 130° C. or higher and 170° C. or lower. This makes it possible to more reliably form a plurality of perovskite crystals extending with the thickness direction of the substrate as the longitudinal direction.

In the method for manufacturing a radiation detector according to one aspect of the present disclosure, the second step may include supplying the carrier gas at a flow rate of 0.25 L/min or more and less than 0.45 L/min. This makes it possible to reliably form a plurality of perovskite crystals extending in the thickness direction of the substrate serving as a longitudinal direction.

In the method for manufacturing a radiation detector according to one aspect of the present disclosure, the second step may include supplying the carrier gas at a flow rate of 0.30 L/min or more and less than 0.45 L/min. This makes it possible to more reliably form a plurality of perovskite crystals extending with the thickness direction of the substrate as the longitudinal direction.

In the method for manufacturing a radiation detector according to one aspect of the present disclosure, the first step may include dissolving the perovskite material in a solvent containing DMSO and DMF at a volume ratio of DMSO:DMF=1:0 or more and 10 or less to generate the solution containing the perovskite material. This makes it possible to reliably form a plurality of perovskite crystals extending in the thickness direction of the substrate serving as a longitudinal direction.

In the method for manufacturing a radiation detector according to one aspect of the present disclosure, the first step may include dissolving the perovskite material in a solvent containing DMSO and DMF at a volume ratio of DMSO:DMF=1:0 or more and 5 or less to generate the solution containing the perovskite material. This makes it possible to more reliably form a plurality of perovskite crystals extending with the thickness direction of the substrate as the longitudinal direction.

In the method for manufacturing a radiation detector according to one aspect of the present disclosure, the third step may include heating the substrate with a temperature of a boiling point of the solvent+20° C. as an upper limit value. This makes it possible to reliably form a plurality of perovskite crystals extending in the thickness direction of the substrate serving as a longitudinal direction.

Advantageous Effects of Invention

According to the present disclosure, it is possible to provide a radiation detector capable of ensuring radiation absorption efficiency while curbing a decrease in charge collection efficiency and an increase in crosstalk between a plurality of pixels, and a method for manufacturing such a radiation detector.

DESCRIPTION OF EMBODIMENTS

Figure 1:
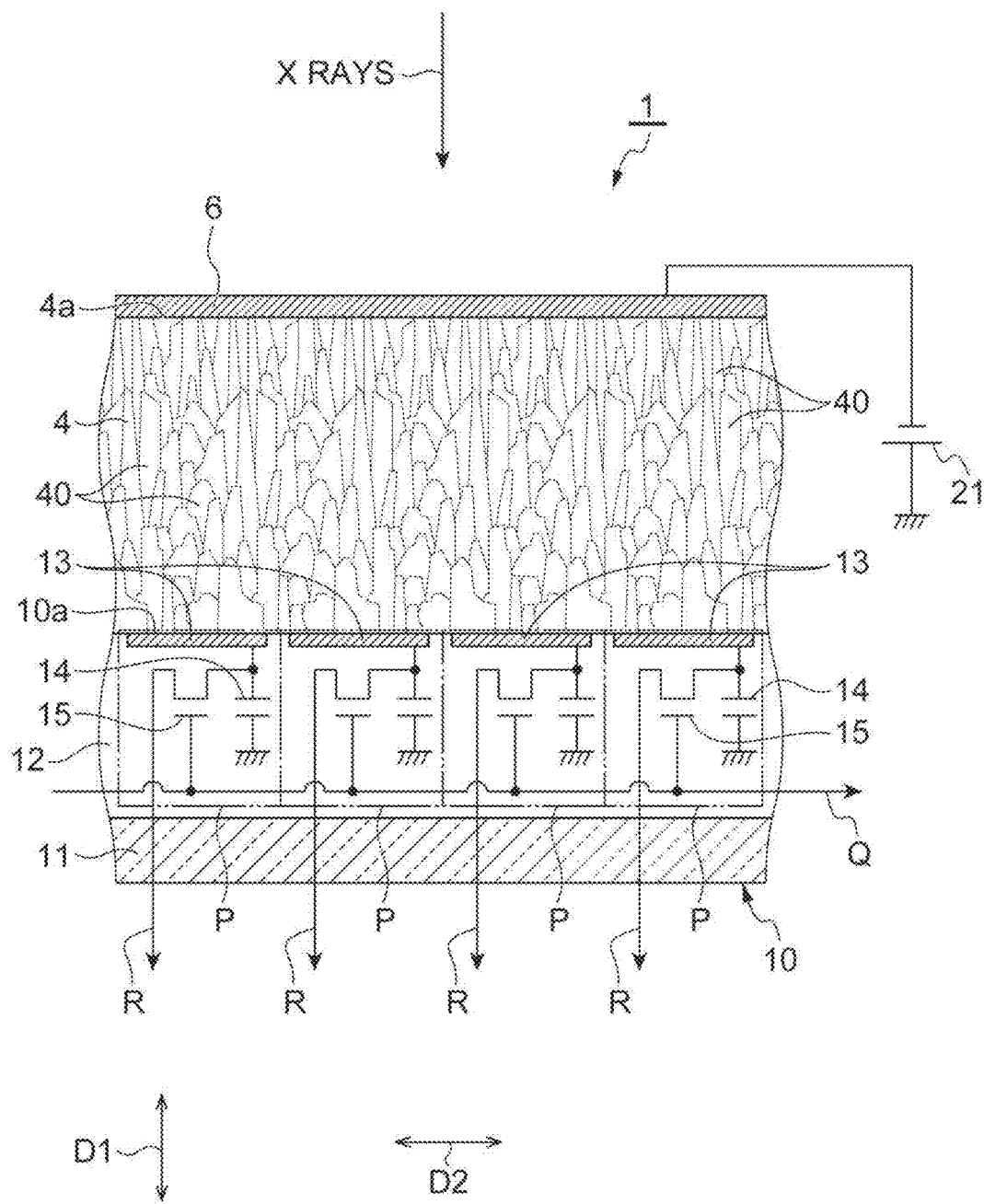
FIG. 1 is a partial cross-sectional view of a radiation detector according to an embodiment.

Hereinafter, embodiments of the present disclosure will be described in detail with reference to the drawings. In respective figures, the same or corresponding parts are denoted by the same reference numerals, and duplicate description will be omitted. [Configuration of radiation detector]

The radiation detector 1 includes a panel (substrate) 10, a radiation absorption layer 4, and an electrode 6, as illustrated in FIG. 1. The radiation detector 1 is a solid-state imaging device that detects X-rays as radiation in order to form an X-ray transmission image, for example. In the radiation detector 1, the second electrode portion is configured of one electrode 6.

A panel 10 includes a support substrate 11 formed of an insulating material such as glass, and a functional layer 12 in which a plurality of pixels P are provided. Each pixel P includes an electrode 13, a capacitor 14, and a thin film transistor 15. In the radiation detector 1, a plurality of the electrodes 13 constitute a first electrode portion. One electrode of the capacitor 14 is electrically connected to the electrode 13. The other electrode of the capacitor 14 is electrically connected to a ground potential. One current terminal of the thin film transistor 15 is electrically connected to a wiring that electrically connects the one electrode of the capacitor 14 to the electrode 13. The other current terminal of the thin film transistor 15 is electrically connected to a reading wiring R. A control terminal of the thin film transistor 15 is electrically connected to a row selection wiring Q.

The thin film transistor 15 has a configuration of a field effect transistor (FET) or a bipolar transistor. When the thin film transistor 15 has the configuration of the FET, the control terminal corresponds to a gate, and the current terminal corresponds to a source or a drain. When the thin film transistor 15 has the configuration of the bipolar transistor, the control terminal corresponds to a base, and the current terminal corresponds to a collector or an emitter.

Figure 2:
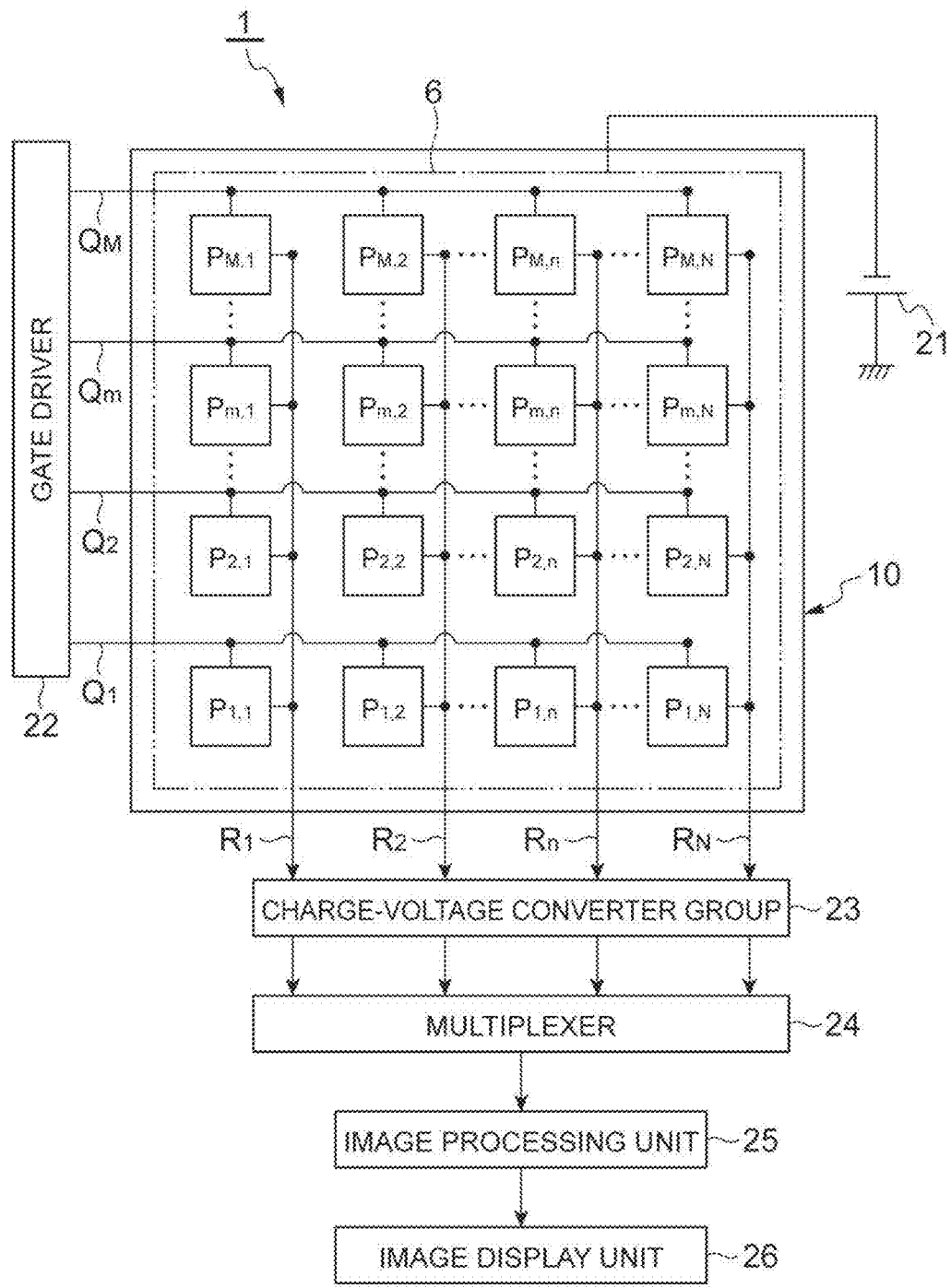
FIG. 2 is a configuration diagram of the radiation detector of FIG. 1.

In the panel 10, a plurality of pixels P are disposed in a matrix form, as illustrated in FIG. 2. A pixel $P_{m,n}$ is a pixel that is located in an m-th row and an n-th column. m is an integer equal to or greater than 1 and equal to or smaller than M (an integer of 2 or more), and n is an integer equal to or greater than 1 and equal to or smaller than N (an integer of 2 or more). The control terminal (see FIG. 1) of the thin film transistor 15 included in each of the N pixels $P_{m,n}$ disposed in the m-th row is electrically connected to one row selection wiring $Q_m$ disposed in the m-th row. The other current terminal (see FIG. 1) of the thin film transistor 15 included in each of the M pixels $P_{m,n}$ disposed in the n-th column is electrically connected to one reading wiring Rn disposed in the n-th column.

The radiation absorption layer 4 is disposed on a surface 10a on one side of the panel 10, as illustrated in FIG. 1. That is, the radiation absorption layer 4 is disposed on one side with respect to the panel 10. The radiation absorption layer 4 is configured of a plurality of perovskite crystals 40. Examples of the perovskite material constituting the perovskite crystal 40 include $PbX_2$ (X=Cl, Br, I) and CsY (Y=Cl, Br, I) (for example, $CsPbBr_3$). When incident X-rays are absorbed by the radiation absorption layer 4, charges (electrons and holes) are generated according to the amount of absorption.

A thickness of the radiation absorption layer 4 is, for example, 1 μm to 2 mm. When the thickness of the radiation absorption layer 4 is 100 μm or more, X-ray absorption efficiency is improved. When the thickness of the radiation absorption layer 4 is 1 mm or less, disappearance of charges generated due to absorption of the X-rays (that is, disappearance due to recombination of electrons and holes) is curbed, and charge collection efficiency is improved.

The electrode 6 is disposed on a surface 4a on one side in the radiation absorption layer 4. That is, the electrode 6 is disposed on one side with respect to the radiation absorption layer 4. The electrode 6 is opposite to the plurality of electrodes 13 with the radiation absorption layer 4 interposed therebetween. The electrode 6 is formed of a conductive material. Examples of the conductive material include a metal such as aluminum, gold, silver, platinum, and titanium, a conductive metal oxide such as tin-added indium oxide (ITO), fluorine-added tin oxide (FTO), tin oxide ($SnO_2$), indium zinc oxide (IZO), or zinc oxide (ZnO), and an organic conductive material including conductive polymers.

The radiation detector 1 configured as described above is used as follows. The electrode 6 of the radiation detector 1 is electrically connected to a bias voltage supply power supply 21, as illustrated in FIG. 2. The bias voltage supply power supply 21 applies a bias voltage to the electrode 6 so that a negative potential difference is generated with respect to the plurality of electrodes 13 included in the panel 10. The row selection wiring $Q_m$ of the radiation detector 1 is electrically connected to a gate driver 22. The reading wiring Rn of the radiation detector 1 is electrically connected to a multiplexer 24 via a charge-voltage converter group 23. Further, the multiplexer 24 is electrically connected to an image processing unit 25, and the image processing unit 25 is electrically connected to an image display unit 26. The gate driver 22, the charge-voltage converter group 23, the multiplexer 24, and the like may be formed in the panel 10 as a configuration of the radiation detector 1.

In this state, as illustrated in FIG. 1, when the X-rays with which an imaging target has been irradiated are incident on the radiation absorption layer 4 and the X-rays are absorbed in the radiation absorption layer 4, charges (electrons and holes) are generated according to the amount of absorption of the X-rays in the radiation absorption layer 4. The electrons generated in the radiation absorption layer 4 are collected by the electrode 13 of each pixel P and accumulated in the capacitor 14 of each pixel P. On the other hand, the holes generated in the radiation absorption layer 4 are collected in the electrode 6.

A control signal is transmitted from the gate driver 22 via the row selection wiring $Q_m$ of the m-th row, and the thin film transistor 15 of each pixel $P_{m,n}$ of the m-th row is turned ON, as illustrated in FIGS. 1 and 2. The gate driver 22 sequentially performs the transmission of this control signal for all the row selection wirings $Q_m$. Accordingly, the charges (electrons) accumulated in the capacitor 14 of each pixel $P_{m,n}$ in the m-th row are input to the charge-voltage converter group 23 via the corresponding reading wiring Rn, and a voltage signal according to the amount of charges is input to the multiplexer 24. The multiplexer 24 sequentially outputs the voltage signal according to the amount of charges accumulated in the capacitor 14 of each pixel $P_{m,n}$ to the image processing unit 25. The image processing unit 25 forms an X-ray transmission image of the imaging target on the basis of the voltage signal input from the multiplexer 24, and displays the X-ray transmission image on the image display unit 26.

[Configuration of Perovskite Crystal]

The perovskite crystal 40 is formed to extend with a direction (first direction) D1 as a longitudinal direction in the region between the plurality of electrodes 13 and the electrode 6 in the radiation absorption layer 4, as illustrated in FIG. 1. That is, in the perovskite crystal 40, when an outer width of the perovskite crystal 40 is maximized in a certain direction, the direction is a direction in a direction D1. In other words, the perovskite crystal 40 can be said to be a columnar crystal or an elongated crystal with the direction D1 as a longitudinal direction, or a columnar crystal or an elongated crystal extending in the direction D1. The perovskite crystal 40 is, for example, a polycrystal of a perovskite material. The direction D1 is a direction in which the plurality of electrodes 13 and the electrode 6 are opposite to each other, and coincides with a thickness direction of the panel 10.

In the region between the plurality of electrodes 13 and the electrode 6 in the radiation absorption layer 4, a length of the perovskite crystal 40 in the direction D1 is 2 or more when a width of the perovskite crystal 40 in a direction D2 (a second direction) perpendicular to the direction D1 is 1. In the region between the plurality of electrodes 13 and the electrode 6 in the radiation absorption layer 4, the length of the perovskite crystal 40 in the direction D1 is 10 μm or more. In the region between the plurality of electrodes 13 and the electrode 6 in the radiation absorption layer 4, the length of the perovskite crystal 40 in the direction D1 is smaller than a thickness of the radiation absorption layer 4 in the direction D1. In the present embodiment, the thickness of the radiation absorption layer 4 in the direction D1 is 100 μm or more.

The width of the perovskite crystal 40 in the direction D2 is equal to or smaller than an arrangement pitch of the plurality of electrodes 13 in the region between the plurality of electrodes 13 and the electrode 6 in the radiation absorption layer 4. The width of the perovskite crystal 40 in the direction D2 is 50 μm or less in the region between the plurality of electrodes 13 and the electrode 6 in the radiation absorption layer 4. An existence rate of the perovskite crystals 40 is 80% or more in the region between the plurality of electrodes 13 and the electrode 6 in the radiation absorption layer 4. The perovskite crystal 40 is in contact with at least another perovskite crystal 40 in the region between the plurality of electrodes 13 and the electrode 6 in the radiation absorption layer 4. The arrangement pitch of the plurality of electrodes 13 is a distance between centers of adjacent electrodes 13. Further, the existence rate of the perovskite crystals 40 in a certain region is a ratio of a volume of the plurality of perovskite crystals 40 present in the region to a volume of the region.

A shape, length, width, and existence rate of the perovskite crystal 40 described above can be confirmed as follows. First, the radiation absorption layer 4 is cut so that the region between the plurality of electrodes 13 and the electrode 6 in the radiation absorption layer 4 is divided into four equal parts in the direction D2 and is divided into four equal parts in a direction perpendicular to the direction D1 and the direction D2. In each of cut surfaces of the radiation absorption layer 4 (which may be any one of a pair of cut surfaces facing each other), a cross-sectional region between the plurality of electrodes 13 and the electrode 6 is observed. The shape, length, width, and existence rate of the perovskite crystal 40 in the cross-sectional region can be presumed to be the shape, length, width, and existence rate of the perovskite crystal 40 described above.

[Action and Effects]

In the radiation detector 1, the radiation absorption layer 4 is configured of a plurality of perovskite crystals 40, and each of the plurality of perovskite crystals 40 is formed to extend with the direction D1 in which the plurality of electrodes 13 and the electrode 6 are opposite to each other as a longitudinal direction, in the region between the plurality of electrodes 13 and the electrode 6 in the radiation absorption layer 4. Thereby, even when the thickness of the radiation absorption layer 4 is increased in order to ensure the radiation absorption efficiency, a decrease in charge collection efficiency at the plurality of electrodes 13 and an increase in crosstalk between the plurality of electrodes 13 are curbed. The decrease in charge collection efficiency at the plurality of electrodes 13 is curbed because a grain boundary gap in the radiation absorption layer 4 is reduced such that a moving speed of charges is increased. Therefore, according to the radiation detector 1, it is possible to ensure the radiation absorption efficiency while curbing the decrease in the charge collection efficiency and the increase in crosstalk between the plurality of pixels P.

Further, the length of the perovskite crystal 40 in the direction D1 is 2 or more when the width of the perovskite crystal 40 in the direction D2 perpendicular to the direction D1 is 1 in the region between the plurality of electrodes 13 and the electrode 6 in the radiation absorption layer 4. This makes it possible to more reliably curb a decrease in charge collection efficiency and an increase in crosstalk between a plurality of pixels. In view of this, the length of the perovskite crystal 40 in the direction D1 is more preferably 20 or more when the width of the perovskite crystal 40 in the direction D2 is 1.

Further, the length of the perovskite crystal 40 in the direction D1 is 10 μm or more in the region between the plurality of electrodes 13 and the electrode 6 in the radiation absorption layer 4. This makes it easy to increase the thickness of the radiation absorption layer 4, and thus it is possible to easily and reliably ensure the radiation absorption efficiency.

Further, the width of the perovskite crystal 40 in the direction D2 perpendicular to the direction D1 is equal to or smaller than the arrangement pitch of the plurality of electrodes 13 in the region between the plurality of electrodes 13 and the electrode 6 in the radiation absorption layer 4. This makes it possible to more reliably curb an increase in crosstalk between the plurality of pixels P and obtain an X-ray transmission image with high sharpness.

Further, the existence rate of the perovskite crystal 40 is 80% or more in the region between the plurality of electrodes 13 and the electrode 6 in the radiation absorption layer 4. This makes it possible to ensure radiation absorption efficiency more reliably.

Further, the perovskite crystal 40 is in contact with at least another perovskite crystal 40 in the region between the plurality of electrodes 13 and the electrode 6 in the radiation absorption layer 4. This makes it possible to ensure radiation absorption efficiency more reliably.

Further, the length of the perovskite crystal 40 in the direction D1 is smaller than the thickness of the radiation absorption layer 4 in the direction D1 in the region between the plurality of electrodes 13 and the electrode 6 in the radiation absorption layer 4. This makes it possible to reliably form the radiation absorption layer 4 configured of the plurality of perovskite crystals 40 each extending with the direction D1 as a longitudinal direction even when the thickness of the radiation absorption layer 4 is increased in order to ensure the radiation absorption efficiency.

The thickness of the radiation absorption layer 4 in the direction D1 is 100 µm or more in the region between the plurality of electrodes 13 and the electrode 6 in the radiation absorption layer 4. This makes it possible to ensure radiation absorption efficiency more reliably.

[Manufacturing Method for Radiation Detector]

First, the perovskite material is dissolved in a solvent to form a precursor solution. Examples of the perovskite material include $PbX_2$ (X=Cl, Br, I) and CsY (Y=Cl, Br, I). The solvent is, for example, an organic solvent such as γ-butyrolactone, N-methyl-2-pyrrolidone, N,N-dimethylformamide (DMF), or dimethylsulfoxide (DMSO). However, the solvent may be a solvent that can dissolve the perovskite material, may be formed of one type of solvent, or may be formed of two or more types of solvents. When $PbX_2$ and CsY are used as the perovskite materials, a molar ratio of the perovskite materials is, for example, $PbX_2$:CsY=1:1 to 2:1, and a concentration of the perovskite materials in the precursor solution is, for example, 10 to 100 mmol/L.

Figure 3:
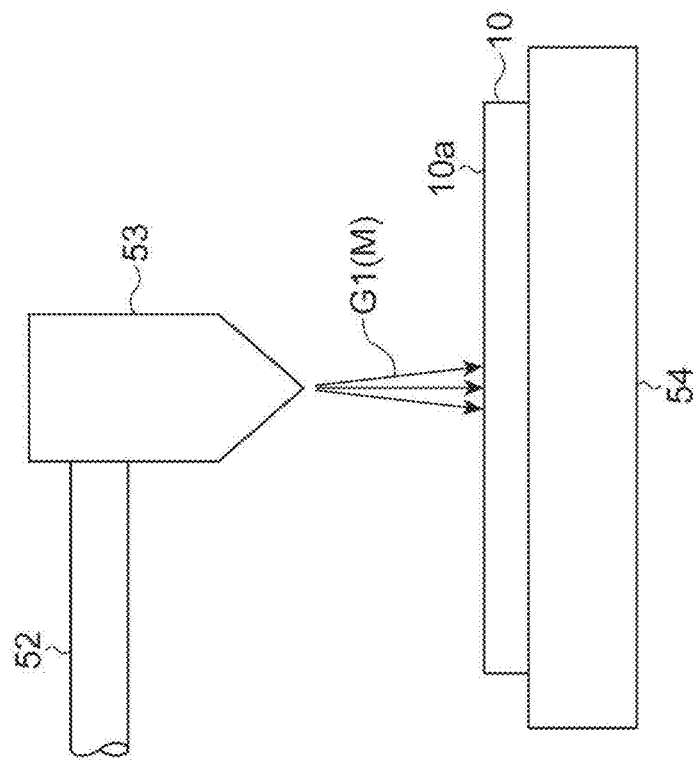
FIG. 3 is a schematic diagram illustrating a method for manufacturing the radiation detector of FIG. 1.
Figure 3:
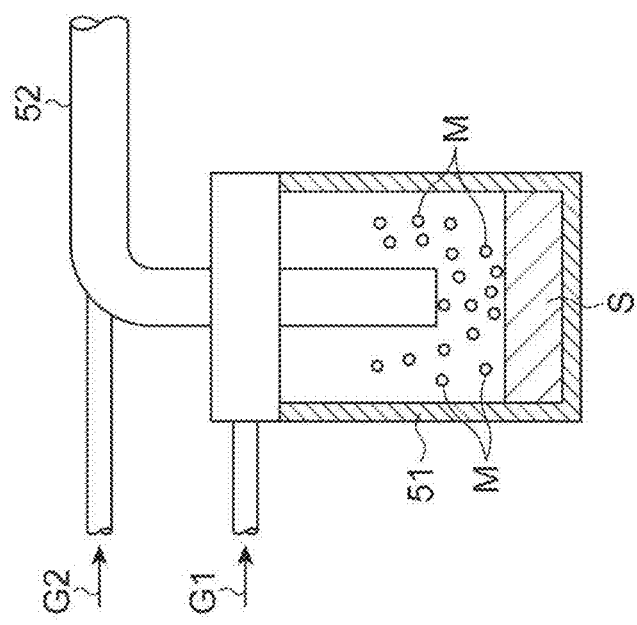

Subsequently, as illustrated in FIG. 3, the generated precursor solution S is put in an atomization container 51, and the mist M is generated from the precursor solution S through ultrasonic vibration. That is, the mist M is generated through ultrasonic vibration from the precursor solution S that is a solution containing the perovskite material (first step). A frequency of ultrasonic vibration is 2.4 MHz, for example. It is possible to adjust a size of the mist M by adjusting the frequency of ultrasonic vibration. When a particle size of the mist M exceeds 10 µm, a sedimentation rate of the mist M in the air exceeds 1 mm/sec and retention of the mist M in the air becomes impossible, and thus the particle size is preferably 10 µm or less.

Subsequently, when the mist M is sufficiently generated and an amount of the mist in the atomization container 51 stabilizes, a carrier gas G1 and a dilution gas G2 flow, the mist M, the carrier gas G1 and the dilution gas G2 are mixed, and the carrier gas G1 containing the mist M is carried to a nozzle 53 through a flow path 52. That is, the mist M and the dilution gas G2 are mixed with the carrier gas G1 (second step). In the present embodiment, the mist M, the carrier gas G1, and the dilution gas G2 are mixed, and this mixed gas is referred to as the carrier gas G1 containing the mist M.

Next, the carrier gas G1 containing the mist M is sprayed from the nozzle 53 to the panel 10 that is set on a stage 54 with a heating device and heated to a predetermined temperature (for example, 150 to 200° C.). In this case, the stage 54 is operated so that the panel 10, for example, reciprocates with respect to the nozzle 53 and a predetermined amount of mist M adheres to the surface 10a of the panel 10. Thereby, the radiation absorption layer 4 configured of the plurality of perovskite crystals 40 is formed on the surface 10a of the panel 10. That is, the carrier gas G1 containing the mist M is sprayed to the panel 10 in a state in which the panel 10 has been heated, and a plurality of perovskite crystals 40 are formed to extend with the thickness direction of the panel 10 as a longitudinal direction in a region corresponding to the plurality of electrodes 13 in a region on the panel 10, and the radiation absorption layer 4 configured of the plurality of perovskite crystals 40 is formed on one side with respect to the panel 10 (third step).

In this step, the adhesion of the mist M on the surface 10a of the panel 10 and evaporation of the solvent from the mist M (that is, deposition of the perovskite material) are repeated, so that the plurality of perovskite crystals 40 are formed on the surface 10a of the panel 10. The mist M is a micro-sized or sub-micro-sized droplet. Droplets of this size are called "droplet microparticles" and have properties of both a liquid and a gas. Therefore, it is possible to form a film using a vapor phase growth method while holding surroundings of the surface 10a of the panel 10 in a solvent atmosphere. As a result, the plurality of perovskite crystals 40 are formed on the surface 10a of the panel 10 to extend with the thickness direction of the panel 10 as a longitudinal direction.

The nozzle 53 may be operated or the nozzle 53 and the stage 54 may not be operated as long as a predetermined amount of mist M can adhere to the surface 10a of the panel 10. Further, a metal mask or a resist may be formed on the surface 10a of the panel 10 in advance to pattern a region in which the radiation absorption layer 4 is formed.

Next, the electrode 6 is formed on the surface 4a of the radiation absorption layer 4. That is, the electrode 6 opposite to the plurality of electrodes 13 is formed on one side with respect to the radiation absorption layer 4 with the region corresponding to the plurality of electrodes 13 interposed therebetween in the region on the panel 10 (fourth step). The electrode 6 can be formed using spray coating, screen printing, spin coating, or the like. Alternatively, the electrode 6 can be formed using a vapor deposition method, a sputtering method, or the like.

Thus, the radiation detector 1 is obtained. According to the method for manufacturing the radiation detector 1 described above, it is possible to manufacture the radiation detector 1 including the radiation absorption layer 4 as described above.

Further, in the step of generating the mist M from the precursor solution S that is a solution containing the perovskite material, the mist M is generated from the precursor solution S through ultrasonic vibration. This makes it possible to generate the suitable mist M easily and reliably.

Further, in the step of mixing the mist M with the carrier gas G1, the dilution gas G2 is mixed with the carrier gas G1. This makes it possible to adjust a concentration of the mist M, which is important for formation of the plurality of perovskite crystals 40 to extend with the thickness direction of the panel 10 as a longitudinal direction.

Modification Example

The present disclosure is not limited to the above-described embodiment. For example, when the radiation absorption layer 4 includes the plurality of perovskite crystals 40 formed to extend with the direction D1 as a longitudinal direction in the region between the plurality of electrodes 13 and the electrode 6 in the radiation absorption layer 4, the radiation absorption layer 4 may include a non-elongated crystal, void, or the like as some of the perovskite crystals 40. In particular, the plurality of perovskite crystals 40 formed to extend with the direction D1 as a longitudinal direction may not be included in a region (for example, an outer edge region of the radiation absorption layer 4 when viewed in the direction D1) other than the region between the plurality of electrodes 13 and the electrode 6 in the radiation absorption layer 4.

Further, the radiation detector 1 may be configured to detect radiation other than X-rays. Further, a bias voltage may be applied to the electrode 6 so that a positive potential difference is generated with respect to the plurality of electrodes 13 included in the panel 10. In this case, each electrode 13 collects the holes generated in the radiation absorption layer 4 through the absorption of X-rays. Further, although the second electrode portion is configured of the one electrode 6 opposite to the plurality of electrodes 13 with the radiation absorption layer 4 interposed therebetween in the above-described embodiment, the second electrode portion may be configured of a plurality of electrodes 6 opposite to the plurality of electrodes 13 withe the radiation absorption layer 4 interposed therebetween. In this case, each electrode 6 may be opposite to at least one electrode 13 with the radiation absorption layer 4 interposed therebetween. Further, although the plurality of electrodes 13 constituting the first electrode portion have a function of the pixel electrodes in the above-described embodiment, the plurality of electrodes 6 constituting the second electrode portion may have a function of the pixel electrodes. In this case, the first electrode portion may be configured of at least one electrode 13 opposite to the plurality of electrodes 6 with the radiation absorption layer 4 interposed therebetween. Further, in this case, the width of the perovskite crystal 40 in the direction D2 perpendicular to the direction D1 is equal to or smaller than the arrangement pitch of the plurality of electrodes 6 in the region between the electrode 13 and the plurality of electrodes 6 in the radiation absorption layer 4. This makes it possible to more reliably curb an increase in crosstalk between the plurality of pixels P, and obtain an X-ray transmission image with high sharpness. The arrangement pitch of the plurality of electrodes 6 means the distance between the centers of the adjacent electrodes 6.

Further, not only a glass substrate but also a silicon substrate or the like can be used as the support substrate 11. In this case, a CMOS ASIC may be configured using FETs formed on the silicon substrate instead of thin film transistors. That is, the panel 10 is not limited to the above-described configuration as long as the substrate has a plurality of electrodes 13.

Further, the radiation detector 1 may include a moisture-proof layer that covers outer surfaces of the panel 10, the radiation absorption layer 4, and the electrode 6. Such a moisture-proof layer can be obtained by forming a resin film using vapor deposition or the like or by forming an oxide film or a nitride film using ALD, CVD, or the like.

Further, although the mist M is generated from the precursor solution S through ultrasonic vibration in the method for manufacturing the radiation detector 1 described above, the mist M may be generated from the precursor solution S using a pressurizing type (a method of applying pressure so that the carrier gas G1 of which a flow velocity is increased collides with the precursor solution S, to generate the mist M), a rotation disc type (a method of dropping the precursor solution S on a disc that is rotating at a high speed and generating the mist M using centrifugal force), an orifice vibration type (a method of applying a vibration using a piezoelectric element or the like to generate the mist M when the precursor solution S passes through between orifice plates), an electrostatic type (a method of applying a voltage to a thin tube spraying the precursor solution S to generate the mist M), or the like.

Further, each configuration included in the radiation detector 1 are not limited to examples of the materials and shapes described above, and various materials and shapes can be applied. Further, each configuration in the embodiment or modification example described above can be arbitrarily applied to each configuration in other embodiment or modification examples.

Examples and Comparative Examples

A substrate having a thickness of 0.7 mm made of borosilicate glass was prepared, and a radiation absorption layer was formed on the surface of the substrate under a condition illustrated in Table 1 below. In temperature verification, only a temperature of the substrate was changed and the radiation absorption layer was formed on the surface of the substrate. In flow rate verification, only a flow rate of the carrier gas was changed and the radiation absorption layer was formed on the surface of the substrate.

TABLE 1

| Condition | Temperature verification | Flow rate verification |
|---|---|---|
| Precursor (mol) | $PbBr_2:CsBr$ = 1:1 | $PbBr_2:CsBr$ = 1:1 |
| Pb Concentration | 50 mmol/L | 60 mmol/L |
| Solvent (vol.) | DMSO:DMF = 1:1 | DMSO:DMF = 1:1 |
| Ultra-sonic generator | 2.4 MHz | 2.4 MHz |
| Carrier gas | $N_2$ 0.3 L/min | $N_2$ 0.25-0.5 L/min |
| Dilution gas | $N_2$ 5.0 L/min | $N_2$ 5.0 L/min |
| Substrate Temp. | 110-190° C. | 160° C. |
| Nozzle Temp. | 50° C. | 50° C. |
| Stage motion | 0.16 mm/sec | 0.16 mm/sec |

Figure 4:
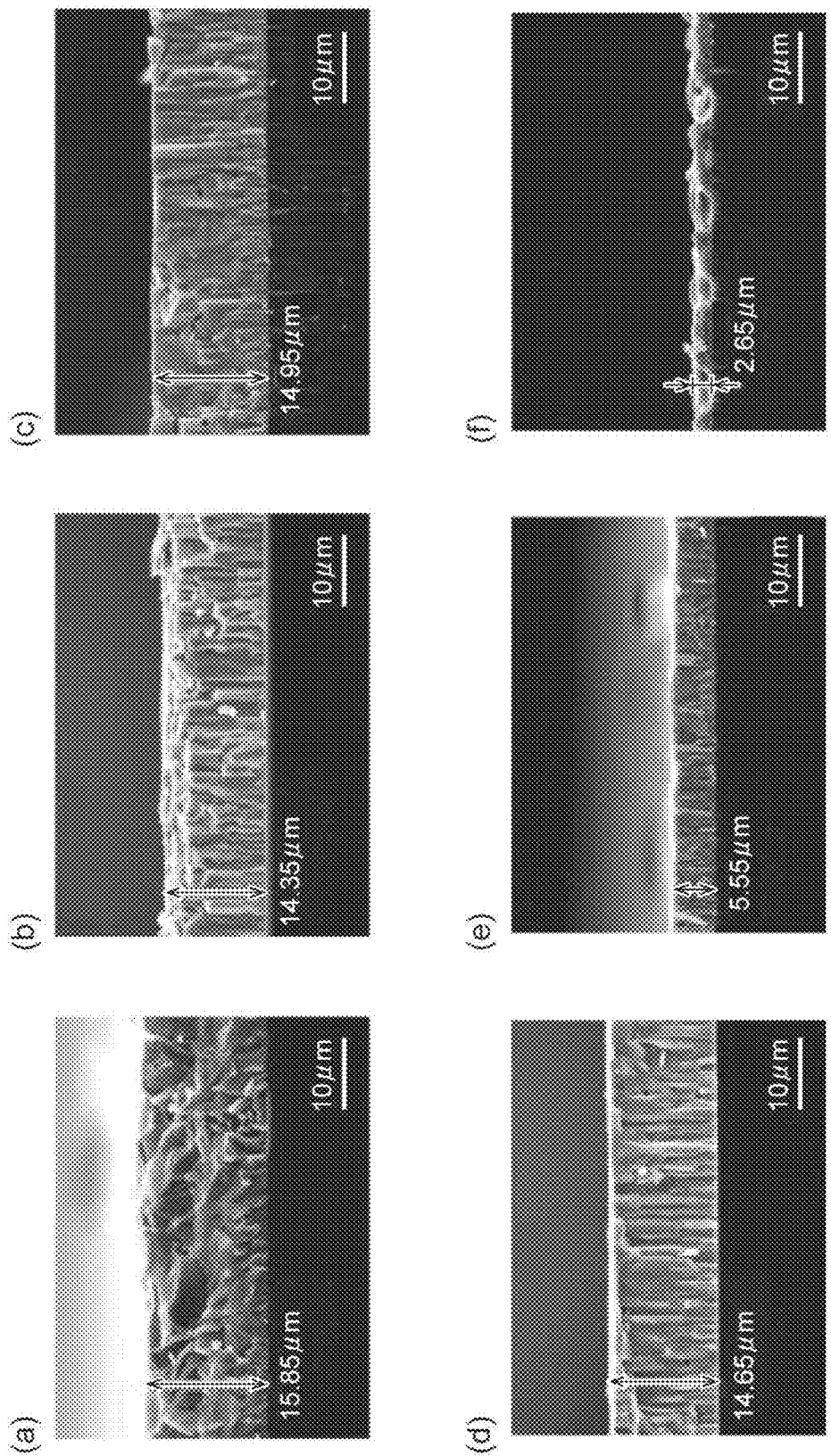
FIG. 4 is a cross-sectional view of a radiation absorption layer when a temperature of a substrate is changed.
Figure 5:
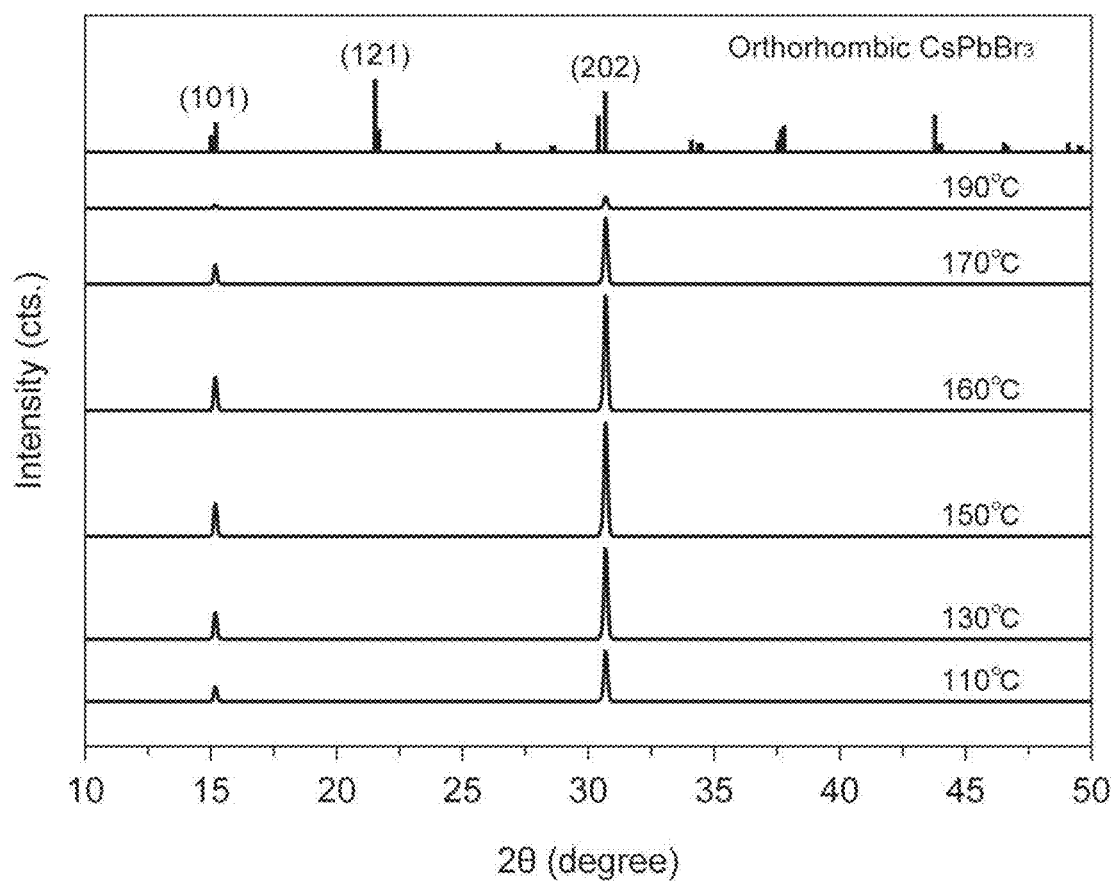
FIG. 5 is a diagram illustrating a result of X-ray diffraction when the temperature of the substrate is changed.

FIG. 4 is a cross-sectional view (SEM image) of the radiation absorption layer when the temperature of the substrate is changed. In FIG. 4, (a) illustrates a case in which the temperature of the substrate is 110° C., (b) illustrates a case in which the temperature of the substrate is 130° C., (c) illustrates a case in which the temperature of the substrate is 150° C., (d) illustrates a case in which the temperature of the substrate is 160° C., (e) illustrates a case in which the temperature of the substrate of 170° C., and (f) illustrates a case in which the temperature of the substrate of 190° C. FIG. 5 is a diagram illustrating a result of X-ray diffraction when the temperature of the substrate is changed.

It was found that as in s preferable for the substrate to be heated to a temperature of 110° C. or higher and 170° C. or lower in the third step described above in order to reliably form a plurality of perovskite crystals extending with a thickness direction of the substrate as a longitudinal direction (hereinafter referred to as "a plurality of elongated perovskite crystals"), as illustrated in FIGS. 4 and 5. It was also found that it is preferable for the substrate to be heated to a temperature of 130° C. or higher and 170° C. or lower in the third step described above in order to more reliably form the plurality of elongated perovskite crystals.

Figure 6:
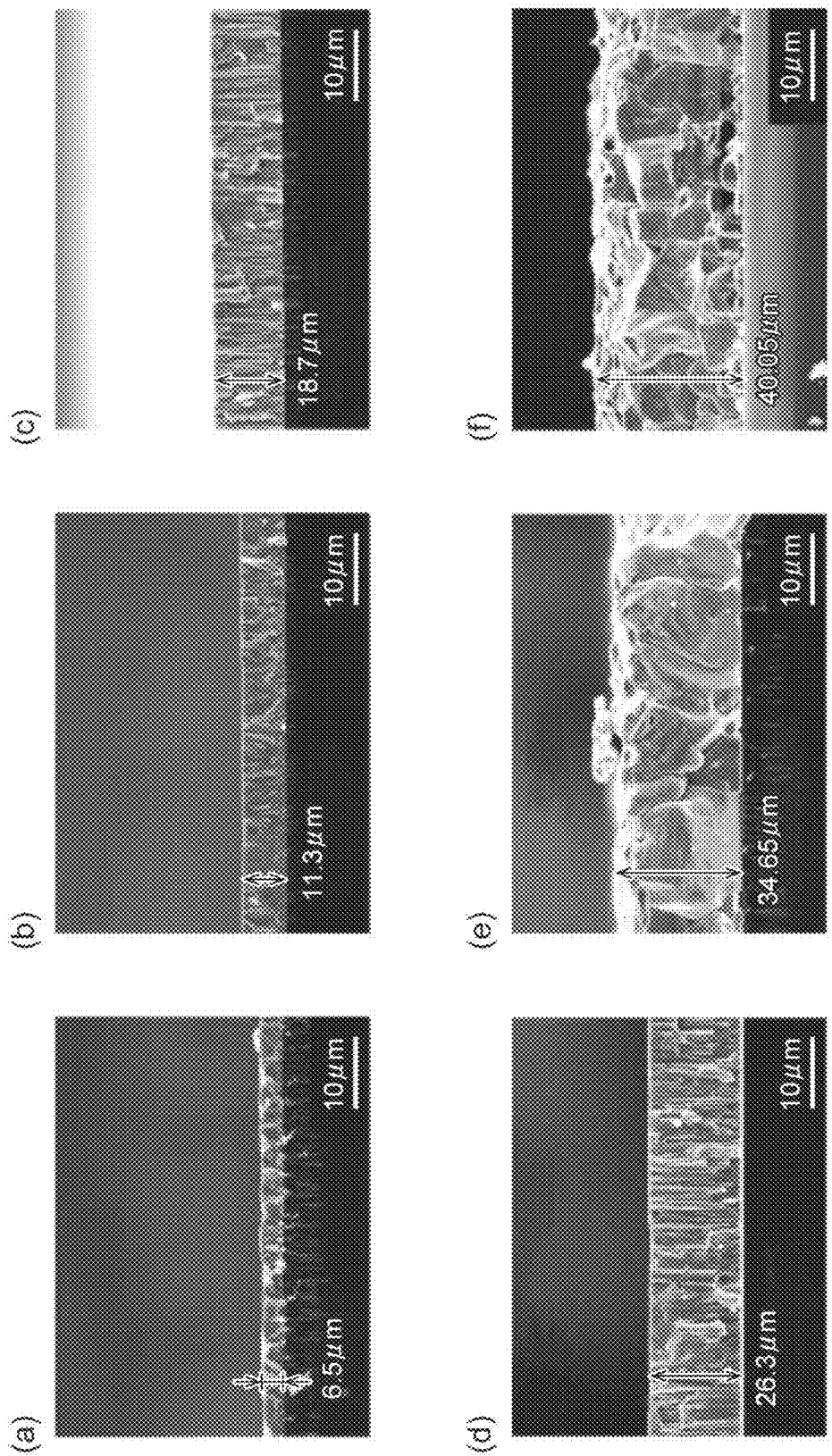
FIG. 6 is a cross-sectional view of a radiation absorption layer when a flow rate of a carrier gas is changed.
Figure 7:
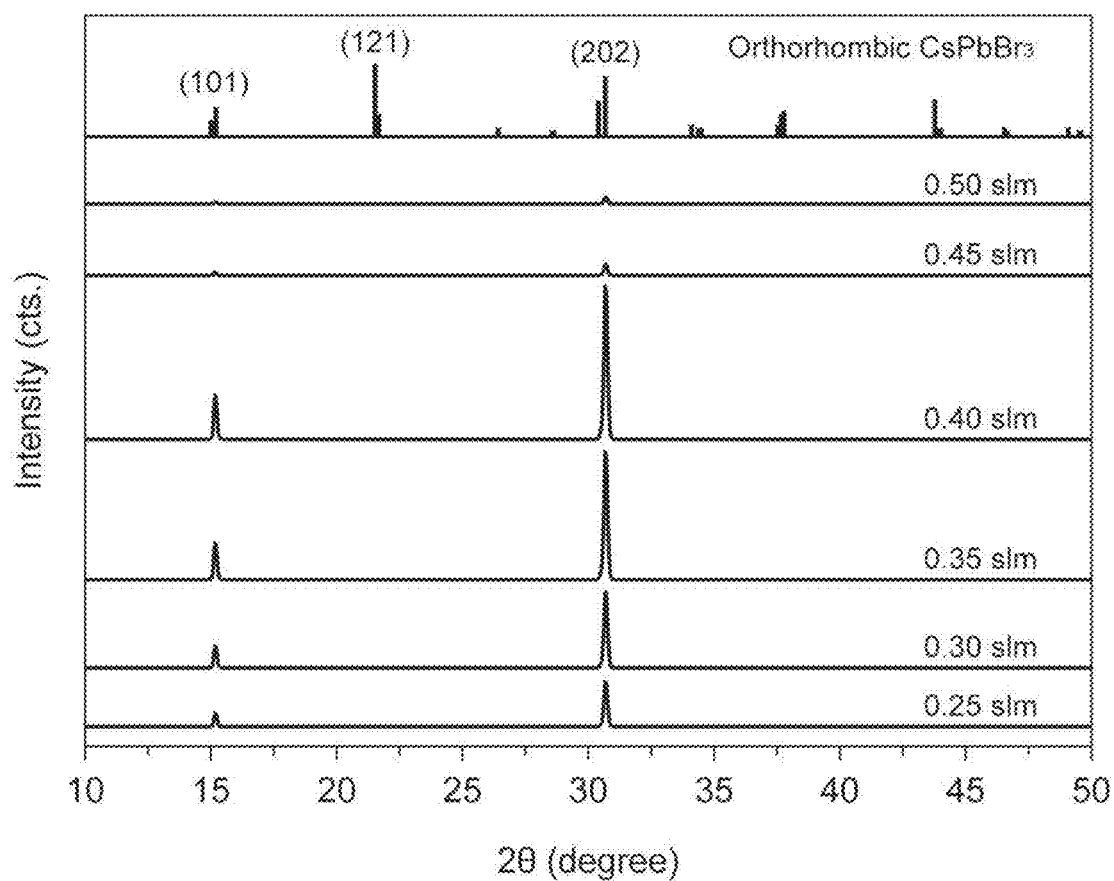
FIG. 7 is a diagram illustrating a result of X-ray diffraction when the flow rate of the carrier gas is changed.

FIG. 6 is a cross-sectional view (SEM image) of the radiation absorption layer when the flow rate of the carrier gas is changed. In FIG. 6, (a) illustrates a case in which a flow rate of the carrier gas is 0.25 L/min, (b) illustrates a case in which the flow rate of the carrier gas is 0.30 L/min, (c) illustrates a case in which the flow rate of the carrier gas is 0.35 L/min, (d) illustrates a case in which the flow rate of the carrier gas is 0.40 L/min, (e) illustrates a case in which the flow rate of the carrier gas is 0.45 L/min, and (f) illustrates a case in which the flow rate of the carrier gas is 0.50 L/min. FIG. 7 is a diagram illustrating a result of X-ray diffraction when the flow rate of the carrier gas is changed.

It was found that it is preferable for the carrier gas to be supplied at a flow rate of 0.25 L/min or more and less than 0.45 L/min in the second step described above in order to reliably form the plurality of elongated perovskite crystals, as illustrated in FIGS. 6 and 7. Further, it was found that it is preferable for the carrier gas to be supplied at a flow rate of 0.30 L/min or more and less than 0.45 L/min in the second step described above in order to more reliably form the plurality of elongated perovskite crystals.

Here, a case in which dimethyl sulfoxide (DMSO) and N,N-dimethylformamide (DMF) are used as a solvent for generating a solution (precursor solution) containing a perovskite material will be examined.

The viscosity of DMSO (1.99 cp at 25° C.) is higher than that of DMF (0.79 cP at 25° C.). Therefore, when a precursor solution is generated with a single solvent of DMSO, it is not possible to obtain a sufficient amount of generated mist with ultrasonic vibration having a frequency of 2.4 MHz. Therefore, it is preferable to mix DMF with DMSO as a solvent in order to obtain a sufficient amount of generated mist.

On the other hand, for saturation solubility of a perovskite material ($PbX_2$ (X=Cl, Br, I) and CsY (Y=Cl, Br, I), saturation solubility of DMF is lower than that of DMSO. Therefore, in a case in which a mixing ratio of DMF to DMSO is too high when the precursor solution is generated, an amount of condensation of the mist in the flow path increases, which may adversely affect the formation of the plurality of elongated perovskite crystals.

As described above, it is preferable that, in the first step described above, the perovskite material is dissolved in the solvent containing DMSO and DMF at a volume ratio of DMSO:DMF=1:0 or more and 10 or less, thereby generating the solution containing the perovskite material, in order to reliably form the plurality of elongated perovskite crystals. Further, it is preferable that, in the first step described above, the perovskite material is dissolved in the solvent containing DMSO and DMF at a volume ratio of DMSO:DMF=1:0 or more and 5 or less, thereby generating the solution containing the perovskite material, in order to more reliably form the plurality of elongated perovskite crystals. A solvent other than DMSO and DMF may be contained as long as the solvent contains DMSO and DMF at the volume ratio described above.

Incidentally, when a frequency of ultrasonic vibration is decreased even in a case in which the precursor solution is generated with a single solvent of DMSO, a generation amount of mist can be increased, but a particle size of the mist becomes large and the liquidity of the mist is impaired. On the other hand, when the frequency of the ultrasonic vibration is increased in a case in which the precursor solution is generated with the single solvent of DMSO, it is not possible to obtain a sufficient amount of mist, as described above. However, when the mixing ratio of DMF to DMSO is too high when the precursor solution is generated, the amount of condensation of the generated mist in the flow path increases, as described above. Therefore, the frequency of the ultrasonic vibration is preferably 100 kHz or more and 10 MHz or less, and more preferably 1 MHz or more and 5 MHz or less.

The above-described numerical range is an example showing a preferable numerical range or a more preferable numerical range. Even when the temperature of the substrate is increased, it is possible to form the plurality of elongated perovskite crystals by increasing the flow rate of the carrier gas or increasing a concentration of the perovskite material in the solution to increase a supply amount of the perovskite material to the substrate. For example, even when the substrate is heated to a temperature of a boiling point of the solvent+20° C., it is possible to form the plurality of elongated perovskite crystals in a case in which the supply amount of the perovskite material to the substrate is increased. It is preferable for the substrate to be heated with the temperature of the boiling point of the solvent+20° C. as an upper limit value in the third step described above in order to reliably form the plurality of elongated perovskite crystals. In a solvent in which a plurality of kinds of solvents are mixed, the boiling point of the solvent means a boiling point of the solvent having a highest boiling point. For example, in a solvent in which DMSO and DMF are mixed, a boiling point of DMSO is 189° C. and a boiling point of DMF is 153° C. and thus, it is preferable for the substrate to be heated with 209° C. (189° C.+20° C.) as an upper limit value.

As examples and comparative examples, a substrate having a thickness of 0.7 mm made of borosilicate glass was prepared, and a radiation absorption layer was formed on the surface of the substrate under a condition illustrated in Table 2 below.

TABLE 2

| Condition | Example 1 | Comparison example 1 | Comparison example 2 |
|---|---|---|---|
| Precursor (mol) | $PbBr_2$:CsBr = 1:1 | $PbBr_2$:CsBr = 1:1 | $PbBr_2$:CsBr = 1:1 |
| Pb Concentration | 60 mmol/L | 60 mmol/L | 80 mmol/L |
| Solvent (vol.) | DMSO:DMF = 1:4 | DMSO:DMF = 1:4 | DMSO:DMF = 1:4 |
| Ultra-sonic generator | 2.4 MHz | 2.4 MHz | 2.4 MHz |
| Carrier gas | $N_2$ 4.0 L/min | $N_2$ 2.0 L/min | $N_2$ 2.0 L/min |
| Dilution gas | $N_2$ 4.0 L/min | $N_2$ 3.0 L/min | $N_2$ 3.0 L/min |
| Substrate Temp. | 150° C. | 230° C. | 150° C. |
| Nozzle Temp. | 50° C. | 50° C. | 50° C. |
| Stage motion | 0.08 mm/sec | 0.16 mm/sec | 0.16 mm/sec |

| Condition | Comparison example 3 | Example 2 | Example 3 |
|---|---|---|---|
| Precursor (mol) | $PbBr_2$:CsBr = 1:1 | $PbBr_2$:CsBr = 1:1 | $PbBr_2$:CsBr = 1:1 |
| Pb Concentration | 80 mmol/L | 50 mmol/L | 50 mmol/L |
| Solvent (vol.) | DMSO:DMF = 1:4 | DMSO:DMF = 1:4 | DMSO:DMF = 1:4 |
| Ultra-sonic generator | 2.4 MHz | 2.4 MHz | 2.4 MHz |
| Carrier gas | $N_2$ 2.0 L/min | $N_2$ 0.4 L/min | $N_2$ 0.6 L/min |
| Dilution gas | $N_2$ 3.0 L/min | $N_2$ 5.0 L/min | $N_2$ 6.0 L/min |
| Substrate Temp. | 180° C. | 190° C. | 190° C. |
| Nozzle Temp. | 50° C. | 50° C. | 50° C. |
| Stage motion | 0.16 mm/sec | 0.16 mm/sec | 0.01 mm/sec |

Figure 8:
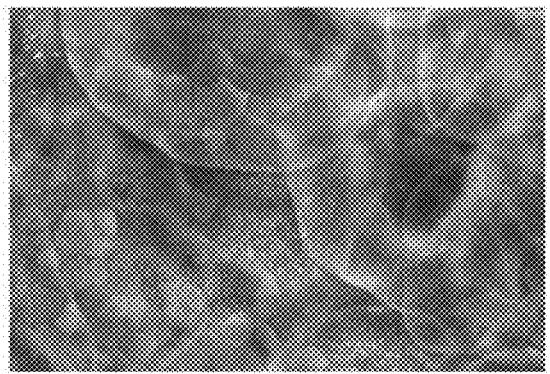
FIG. 8 is a plan view and a cross-sectional view of a radiation absorption layer in Example 1.
Figure 8:
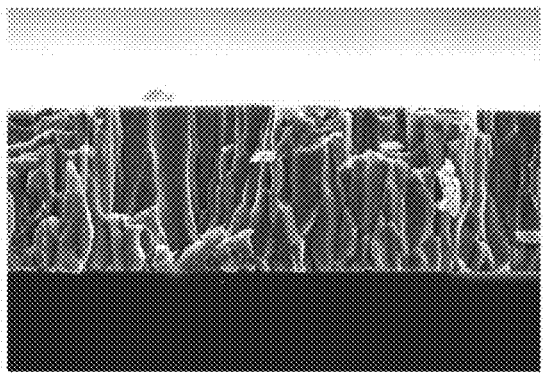

As a result in Example 1 the plurality of elongated perovskite crystals was formed, as illustrated in (a) and (b) of FIG. 8. Example 1 satisfies a more preferable condition (130° C. or higher and 170° C. or lower) regarding the temperature of the substrate and a preferable condition (0.30 L/min or more and less than 0.45 L/min) regarding the flow rate of the carrier gas described above. In (a) and (b) of FIG. 8, the left side is a plan view (SEM image) of the radiation absorption layer, and the right side is a cross-sectional view (SEM image) of the radiation absorption layer.

In Comparative Example 1, the plurality of elongated perovskite crystals was not formed, as illustrated in FIG. (a) of 9. In Comparative Example 1, it is assumed that a density of the mist is increased and a drying rate of the mist is increased, as compared with Example 1. Comparative Example 1 does not satisfy the preferable condition (110° C. or higher and 170° C. or lower) regarding the temperature of the substrate described above and the preferable condition (0.25 L/min or more and less than 0.45 L/min) regarding the flow rate of the carrier gas described above. In (a) of FIG. 9, the left side is a plan view (SEM image) of the radiation absorption layer, and the right side is a cross-sectional view (SEM image) of the radiation absorption layer.

Figure 9:
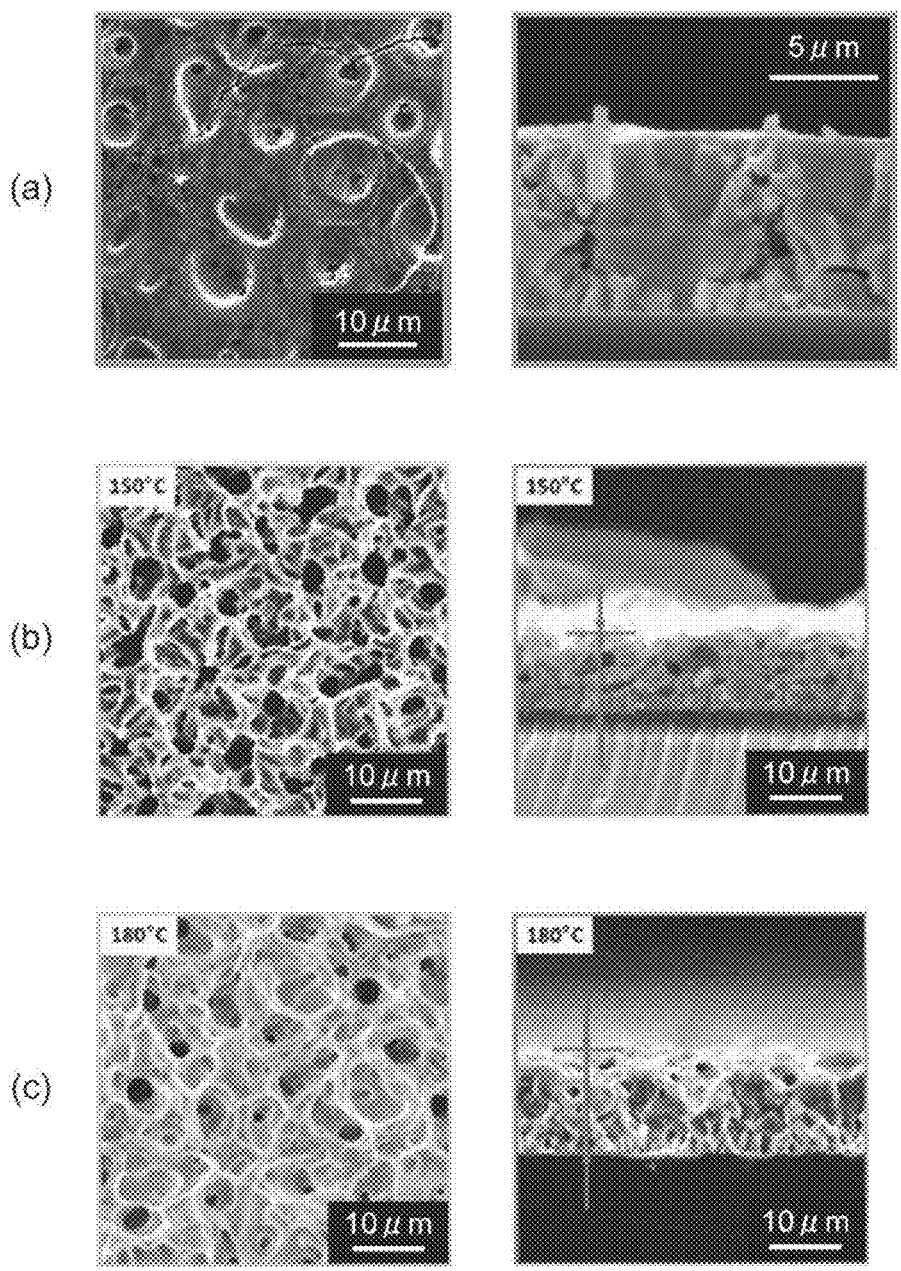
FIG. 9 is a plan view and a cross-sectional view of a radiation absorption layer in Comparative Examples 1 to 3.

In Comparative Example 2, the plurality of elongated perovskite crystals was not formed, as illustrated in (b) of FIG. 9. In Comparative Example 2, a concentration of the precursor in the mist, a density of the mist, and a moving speed of the stage are higher than those in Example 1. Comparative Example 2 satisfies a more preferable condition (130° C. or higher and 170° C. or lower) regarding the temperature of the substrate described above, but does not satisfy a preferable condition (0.25 L/min or more and less than 0.45 L/min) regarding the flow rate of the carrier gas described above. In (b) of FIG. 9, the left side is a plan view (SEM image) of the radiation absorption layer, and the right side is a cross-sectional view (SEM image) of the radiation absorption layer.

In Comparative Example 3, the plurality of elongated perovskite crystals was not formed, as illustrated in (c) of FIG. 9. In Comparative Example 3, a concentration of the precursor in the mist, a density of the mist, and a moving speed of the stage are higher than those in Example 1. Comparative Example 3 does not satisfy the preferable condition (110° C. or higher and 170° C. or lower) regarding the temperature of the substrate described above and the preferable condition (0.25 L/min or more and less than 0.45 L/min) regarding the flow rate of the carrier gas described above. In (c) of FIG. 9, the left side is a plan view (SEM image) of the radiation absorption layer, and the right side is a cross-sectional view (SEM image) of the radiation absorption layer.

Figure 10:
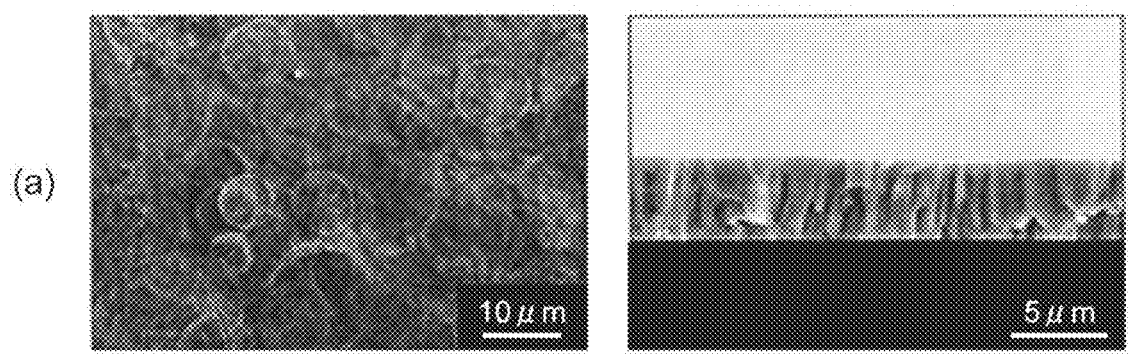
FIG. 10 is a plan view and a cross-sectional view of a radiation absorption layer in Examples 2 and 3.
Figure 10:
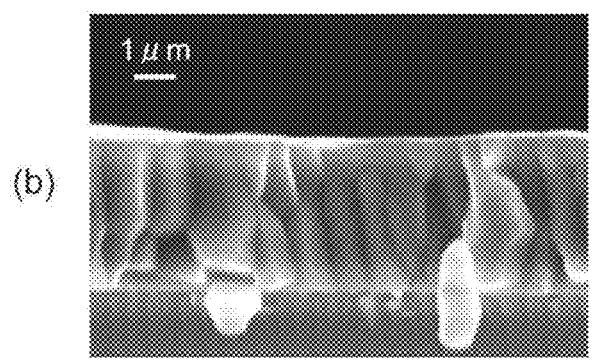

In Examples 2 and 3, a plurality of elongated perovskite crystals was formed, as illustrated in (a) and (b) of FIG. 10. Because an increase in the flow rate of the carrier gas leads to an increase in the amount of mist to be carried, a flow rate of the dilution gas is increased (that is, a density of mist is decreased) in Example 3, as compared with Example 2, thereby achieving balance. Example 2 does not satisfy a preferable condition (110° C. or higher and 170° C. or lower) regarding the temperature of the substrate described above, but satisfies a more preferable condition (0.30 L/min or more and less than 0.45 L/min) regarding the flow rate of the carrier gas described above. Example 3 does not satisfy the preferable condition (110° C. or higher and 170° C. or lower) regarding the temperature of the substrate described above and the preferable condition (0.25 L/min or more and less than 0.45 L/min) regarding the flow rate of the carrier gas described above. It was possible to form the plurality of elongated perovskite crystals. In (a) of FIG. 10, the left side is a plan view (SEM image) of the radiation absorption layer, and the right side is a cross-sectional view (SEM image) of the radiation absorption layer. In (b) of FIG. 10, only a cross-sectional view (SEM image) of the radiation absorption layer is illustrated.

Glass other than borosilicate glass, a substrate made of ITO, Pt or the like, a semiconductor substrate made of Si or the like, an integrated circuit, or the like may be used as the substrate.

Here, a mechanism in a case in which a plurality of elongated perovskite crystals 40 are not formed and a mechanism in a case in which a plurality of elongated perovskite crystals 40 are formed will be described as assumptions.

Figure 11:
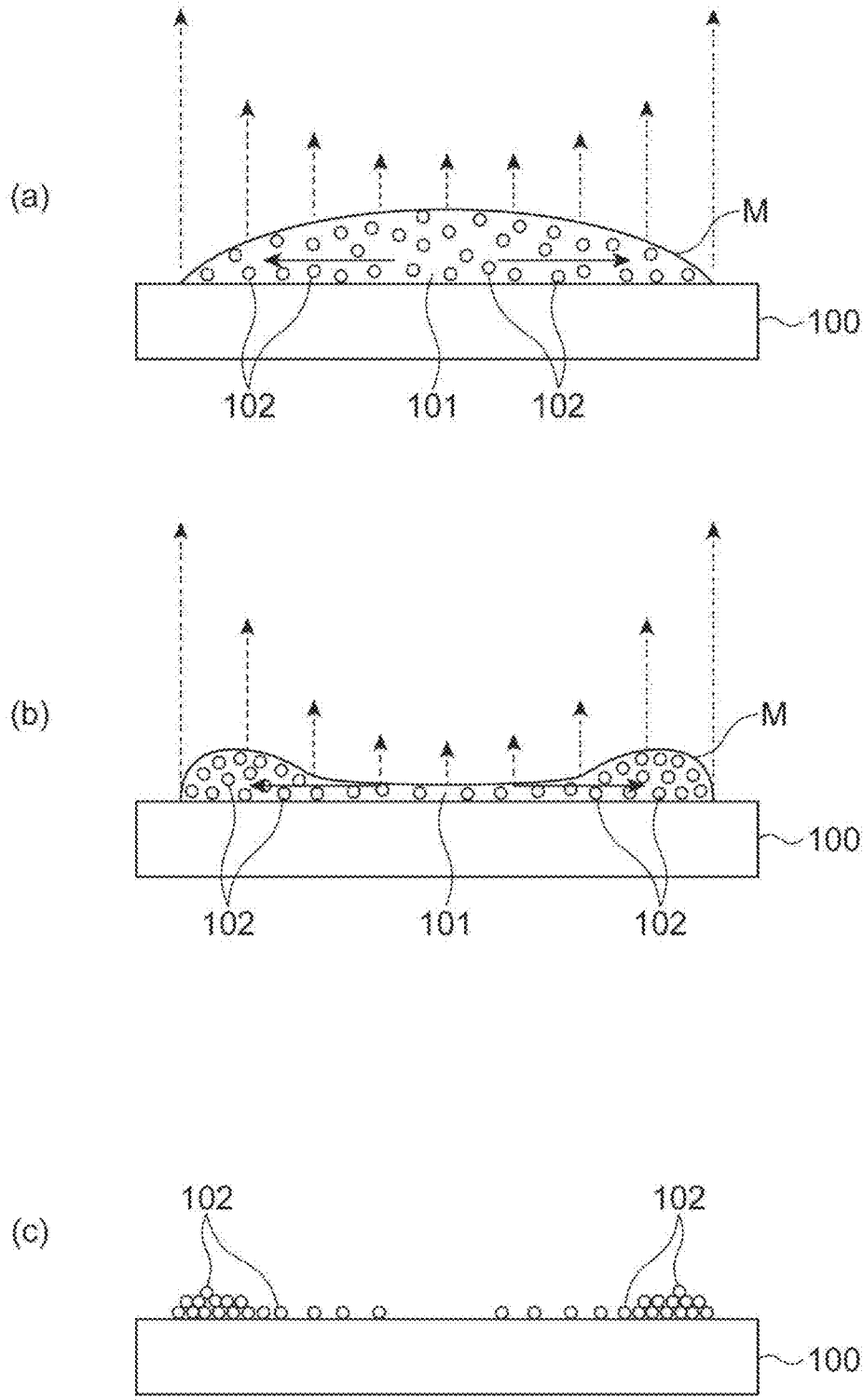
FIG. 11 is a schematic diagram illustrating a mechanism when a plurality of elongated perovskite crystals are not formed.

When a plurality of elongated perovskite crystals 40 are not formed, and the mist M adheres to the surface of the substrate 100 as illustrated in (a) of FIG. 11, a large amount of solvent 101 evaporates from the outside of the mist M before the mist M contracts inward so that a central portion of the mist M becomes thin as illustrated in (b) of FIG. 11, and the perovskite material 102 is deposited in a ring shape (so-called coffee ring phenomenon) as illustrated in (c) of FIG. 11. Thus, under a condition that the perovskite material 102 is deposited in a ring shape, even when the adhesion of the mist M thereon and the evaporation of the solvent 101 from the mist M (that is, the deposition of the perovskite material 102) is repeated, it is assumed that it is difficult for the plurality of elongated perovskite crystals 40 to grow.

Figure 12:
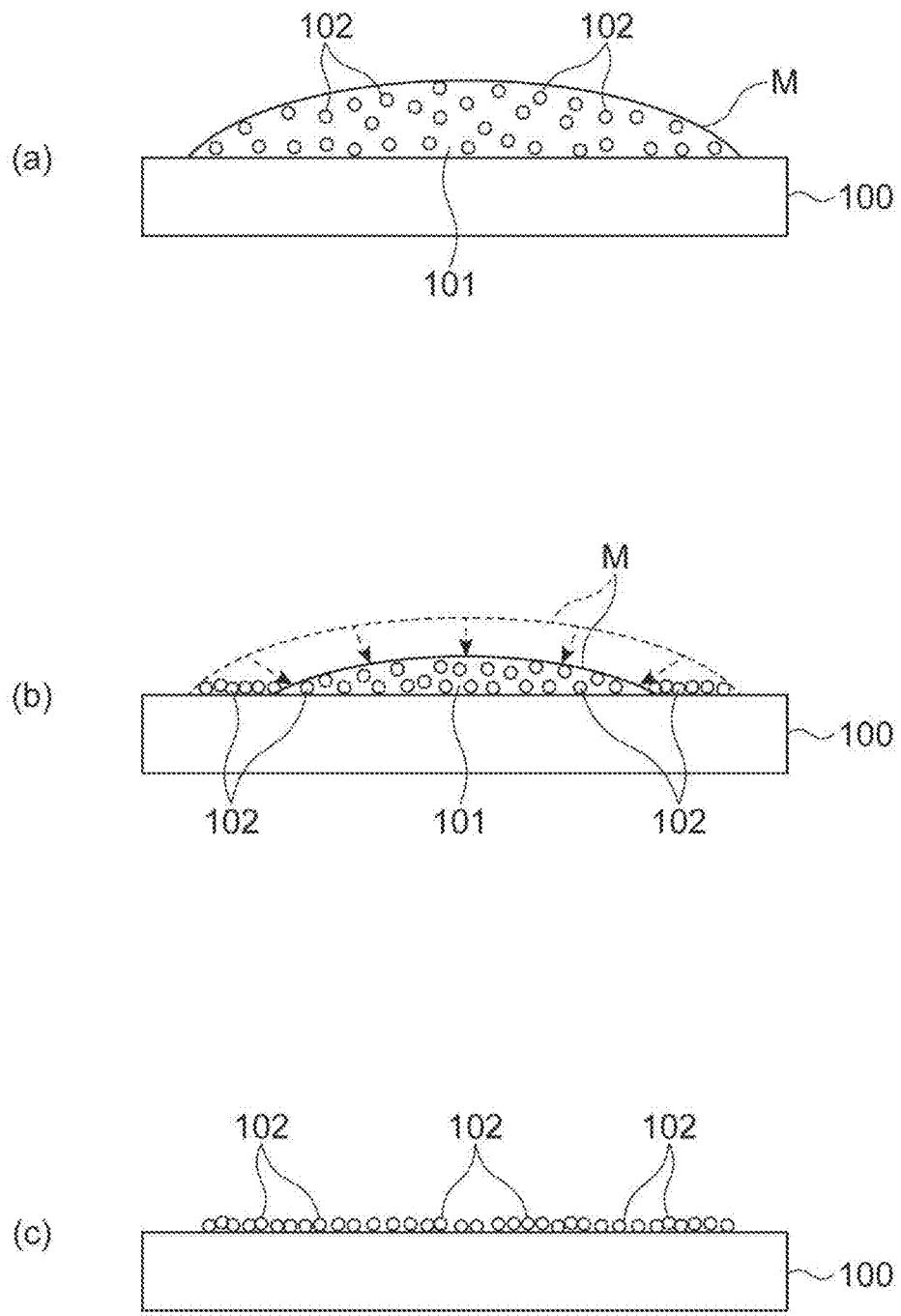
FIG. 12 is a schematic diagram illustrating a mechanism when a plurality of elongated perovskite crystals are formed.

On the other hand, when a plurality of elongated perovskite crystals 40 are formed, and the mist M adheres to the surface of the substrate 100 as illustrated in (a) of FIG. 12, the solvent 101 evaporates from the mist M while the mist M contracts inward so that the central portion of the mist M does not become thin as illustrated in (b) of FIG. 12, and the perovskite material 102 is deposited in a circular shape as illustrated in (c) of FIG. 12. Thus, under a condition that the perovskite material 102 is deposited in the circular shape, the adhesion of the mist M thereon and the evaporation of the solvent 101 from the mist M (that is, the deposition of the perovskite material 102) are repeated and, it is assumed that it is easy for the plurality of elongated perovskite crystals 40 to grow.

REFERENCE SIGNS LIST

1: Radiation detector, 4: Radiation absorption layer, 6: Electrode (second electrode, second electrode portion), 10: Panel (substrate), 13: Electrode (first electrode, first electrode portion), 40: Perovskite Crystal, D1: Direction (first direction), D2: Direction (second direction), G1: Carrier gas, G2: Dilution gas, M: Mist, S: Precursor solution (solution).

The invention claimed is:

1. A radiation detector comprising:
a substrate including a first electrode portion;
a radiation absorption layer disposed on one side with respect to the substrate and configured of a plurality of perovskite crystals; and
a second electrode portion disposed on the one side with respect to the radiation absorption layer and being opposite to the first electrode portion with the radiation absorption layer interposed therebetween,
wherein each of the plurality of perovskite crystals is formed to extend with a first direction in which the first electrode portion and the second electrode portion are opposite to each other as a longitudinal direction in a region between the first electrode portion and the second electrode portion in the radiation absorption layer,
in the region between the first electrode portion and the second electrode portion, a length in the first direction of at least one of the plurality of perovskite crystals is 2 or more when a width of the perovskite crystal in a second direction perpendicular to the first direction is 1,
at least one of the first electrode portion and the second electrode portion is configured by a plurality of electrodes, and
a width of the perovskite crystal in the second direction is equal to or smaller than an arrangement pitch of the plurality of electrodes in the region between the first electrode portion and the second electrode portion.

2. The radiation detector according to claim 1, wherein a length of the perovskite crystal in the first direction is 10 μm or more in the region between the first electrode portion and the second electrode portion.

3. The radiation detector according to claim 1, wherein an existence rate of the perovskite crystals is 80% or more in the region between the first electrode portion and the second electrode portion.

4. The radiation detector according to claim 1, wherein the perovskite crystal is in contact with at least another perovskite crystal in the region between the first electrode portion and the second electrode portion.

5. The radiation detector according to claim 1, wherein a length of the perovskite crystal in the first direction is smaller than a thickness of the radiation absorption layer in the first direction in the region between the first electrode portion and the second electrode portion.

6. The radiation detector according to claim 1, wherein a thickness of the radiation absorption layer in the first direction is 100 μm or more in the region between the first electrode portion and the second electrode portion.

7. A method for manufacturing a radiation detector, comprising:
- a first step of generating mist from a solution containing a perovskite material;
- a second step of mixing the mist with a carrier gas;
- a third step of spraying the carrier gas containing the mist to a substrate including a first electrode portion in a state in which the substrate is heated, forming a plurality of perovskite crystals to extend with a thickness direction of the substrate as a longitudinal direction in a region corresponding to the first electrode portion in a region on the substrate, and forming a radiation absorption layer configured of the plurality of perovskite crystals on one side with respect to the substrate; and
- a fourth step of forming a second electrode portion on the one side with respect to the radiation absorption layer, the second electrode portion being opposite to the first electrode portion with the region corresponding to the first electrode portion interposed therebetween, and
- in the region corresponding to the first electrode portion, a length in the thickness direction of at least one of the plurality of perovskite crystals is 2 or more when a width of the perovskite crystals in a direction perpendicular to the thickness direction is 1,
- at least one of the first electrode portion and the second electrode portion is configured by a plurality of electrodes, and
- a width of the perovskite crystal in the second direction is equal to or smaller than an arrangement pitch of the plurality of electrodes in the region between the first electrode portion and the second electrode portion.

8. The method for manufacturing a radiation detector according to claim 7, wherein the first step includes generating the mist from the solution through ultrasonic vibration.

9. The method for manufacturing a radiation detector according to claim 7, wherein the second step includes mixing a dilution gas with the carrier gas.

10. The method for manufacturing a radiation detector according to claim 7, wherein the third step includes heating the substrate to a temperature of 110° C. or higher and 170° C. or lower.

11. The method for manufacturing a radiation detector according to claim 10, wherein the third step includes heating the substrate to a temperature of 130° C. or higher and 170° C. or lower.

12. The method for manufacturing a radiation detector according to claim 7, wherein the second step includes supplying the carrier gas at a flow rate of 0.25 L/min or more and less than 0.45 L/min.

13. The method for manufacturing a radiation detector according to claim 12, wherein the second step includes supplying the carrier gas at a flow rate of 0.30 L/min or more and less than 0.45 L/min.

14. The method for manufacturing a radiation detector according to claim 7, wherein the first step includes dissolving the perovskite material in a solvent containing DMSO and DMF at a volume ratio of DMSO:DMF=1:0 or more and 10 or less to generate the solution containing the perovskite material.

15. The method for manufacturing a radiation detector according to claim 14, wherein the first step includes dissolving the perovskite material in a solvent containing DMSO and DMF at a volume ratio of DMSO:DMF=1:0 or more and 5 or less to generate the solution containing the perovskite material.

16. The method for manufacturing a radiation detector according to claim 7, wherein the third step includes heating the substrate with a temperature of a boiling point of the solvent+20° C. as an upper limit value.

* * * * *